United States Patent
Huang et al.

(10) Patent No.: US 11,201,142 B2
(45) Date of Patent: Dec. 14, 2021

(54) SEMICONDUCTOR PACKAGE, PACKAGE ON PACKAGE STRUCTURE AND METHOD OF FROMING PACKAGE ON PACKAGE STRUCTURE

(71) Applicant: Taiwan Semiconductor Manufacturing Co., Ltd., Hsinchu (TW)

(72) Inventors: Li-Hsien Huang, Hsinchu County (TW); Chi-Hsi Wu, Hsinchu (TW); Chen-Hua Yu, Hsinchu (TW); Der-Chyang Yeh, Hsin-Chu (TW); Hua-Wei Tseng, New Taipei (TW); Ming-Chih Yew, Hsinchu (TW); Yi-Jen Lai, Hsinchu (TW); Ming-Shih Yeh, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 15/660,968

(22) Filed: Jul. 27, 2017

(65) Prior Publication Data
US 2019/0035772 A1   Jan. 31, 2019

(51) Int. Cl.
*H01L 25/10* (2006.01)
*H01L 23/00* (2006.01)
(Continued)

(52) U.S. Cl.
CPC ........ *H01L 25/105* (2013.01); *H01L 21/4857* (2013.01); *H01L 21/568* (2013.01); *H01L 21/6835* (2013.01); *H01L 23/544* (2013.01); *H01L 24/20* (2013.01); *H01L 25/0657* (2013.01); *H01L 25/50* (2013.01); *H01L 21/486* (2013.01); *H01L 23/3128* (2013.01);
(Continued)

(58) Field of Classification Search
CPC .......................... H01L 23/544; H01L 21/4857
See application file for complete search history.

(56) References Cited

U.S. PATENT DOCUMENTS

| 5,207,585 A | * | 5/1993 | Byrnes | ............... | G01R 1/06711 |
| | | | | | 439/591 |
| 9,391,028 B1 | * | 7/2016 | Chen | ..................... | H01L 23/544 |

(Continued)

*Primary Examiner* — Marcos D. Pizarro
*Assistant Examiner* — Quinton A Brasfield
(74) *Attorney, Agent, or Firm* — JCIPRNET

(57) ABSTRACT

A semiconductor package includes a die, an insulation layer, a plurality of first electrical conductive vias, a plurality of second electrical conductive vias, a plurality of thermal conductive vias and a connecting pattern. The die includes a plurality of first pads and a plurality of second pads. The insulation layer is disposed on the die and includes a plurality of openings exposing the first pads and the second pads. The first electrical conductive vias and the second electrical conductive vias are disposed in the openings and contact the first pads and the second pads respectively. The thermal conductive vias are disposed on the insulation layer. The connecting pattern is disposed on the insulation layer and connects the first electrical conductive vias and the thermal conductive vias. The thermal conductive vias are connected to the first pads through the connecting pattern and the first electrical conductive vias.

9 Claims, 14 Drawing Sheets

(51) Int. Cl.
  *H01L 23/544*   (2006.01)
  *H01L 25/00*    (2006.01)
  *H01L 21/56*    (2006.01)
  *H01L 21/48*    (2006.01)
  *H01L 25/065*   (2006.01)
  *H01L 21/683*   (2006.01)
  *H01L 23/31*    (2006.01)
  *H01L 23/50*    (2006.01)
  *H01L 23/538*   (2006.01)
  *H01L 23/498*   (2006.01)

(52) U.S. Cl.
  CPC ........ *H01L 23/49816* (2013.01); *H01L 23/50* (2013.01); *H01L 23/5389* (2013.01); *H01L 2221/68345* (2013.01); *H01L 2221/68359* (2013.01); *H01L 2223/54426* (2013.01); *H01L 2224/18* (2013.01); *H01L 2224/48091* (2013.01); *H01L 2224/48227* (2013.01); *H01L 2225/06568* (2013.01); *H01L 2924/15311* (2013.01); *H01L 2924/181* (2013.01)

(56) References Cited

U.S. PATENT DOCUMENTS

| | | | |
|---|---|---|---|
| 2014/0210101 A1* | 7/2014 | Lin | H01L 24/97 257/774 |
| 2015/0348912 A1* | 12/2015 | Su | H01L 21/4842 257/666 |
| 2016/0240391 A1* | 8/2016 | Chen | H01L 23/3185 |
| 2016/0300789 A1* | 10/2016 | Chen | H01L 24/20 |
| 2016/0307872 A1* | 10/2016 | Chen | H01L 23/3135 |

\* cited by examiner

SEMICONDUCTOR PACKAGE, PACKAGE ON PACKAGE STRUCTURE AND METHOD OF FROMING PACKAGE ON PACKAGE STRUCTURE

BACKGROUND

As the demand for smaller electronic products grows, manufacturers and others in the electronics industry continually seek ways to reduce the size of integrated circuits used in the electronic products. In that regard, three-dimensional type integrated circuit packaging techniques have been developed and used.

One packaging technique that has been developed is Package-on-Package (PoP). As the name implies, PoP is a semiconductor packaging innovation that involves stacking one package on top of another package. In a conventional Package-on-Package (PoP) process, a top package, in which a first device die is bonded to a bottom package through solder balls. The bottom package may also include a second device die bonded therein. The second device die may be on the same side of the bottom package as the solder balls.

In the bonding process, the solder balls in the top package need to be accurately aligned to the solder balls in the bottom package, so that the solder balls in the top package and the solder balls in the bottom package may be reflowed to join to each other. To perform the alignment, alignment through pillars are formed in the molding compound. However, the conventional alignment schemes suffer from drawbacks such as the alignment through pillars buried in the molding compound due to warpage.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
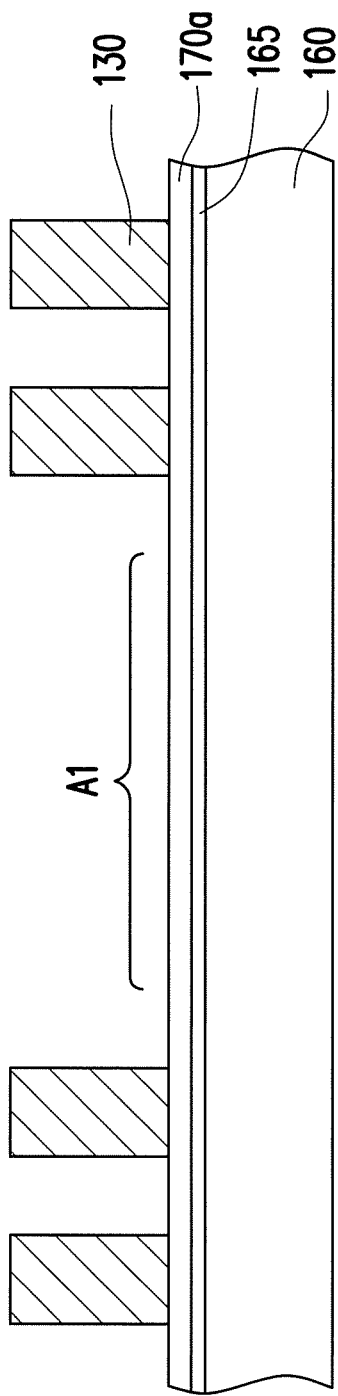
FIG. 1 to FIG. 10 illustrate cross sectional views of intermediate stages in the manufacturing of a package on package structure according to some exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

FIG. 1 to FIG. 10 illustrate cross sectional views of a manufacturing process of a package on package structure according to some exemplary embodiments of the present disclosure. It is noted that the present disclosure will be described with respect to some embodiments in a specific context, namely a Package on Package (PoP) structure. The concepts in the disclosure may also apply, however, to other semiconductor structures or circuits. A semiconductor package applicable for a POP structure, a PoP structure and the method of forming the POP structure are provided in accordance with various embodiments. The intermediate stages of forming the PoP structure are illustrated in accordance with some embodiments. The variations of the embodiments are discussed. Throughout the various views and illustrative embodiments, like reference numbers are used to designate like elements.

Figure 10:
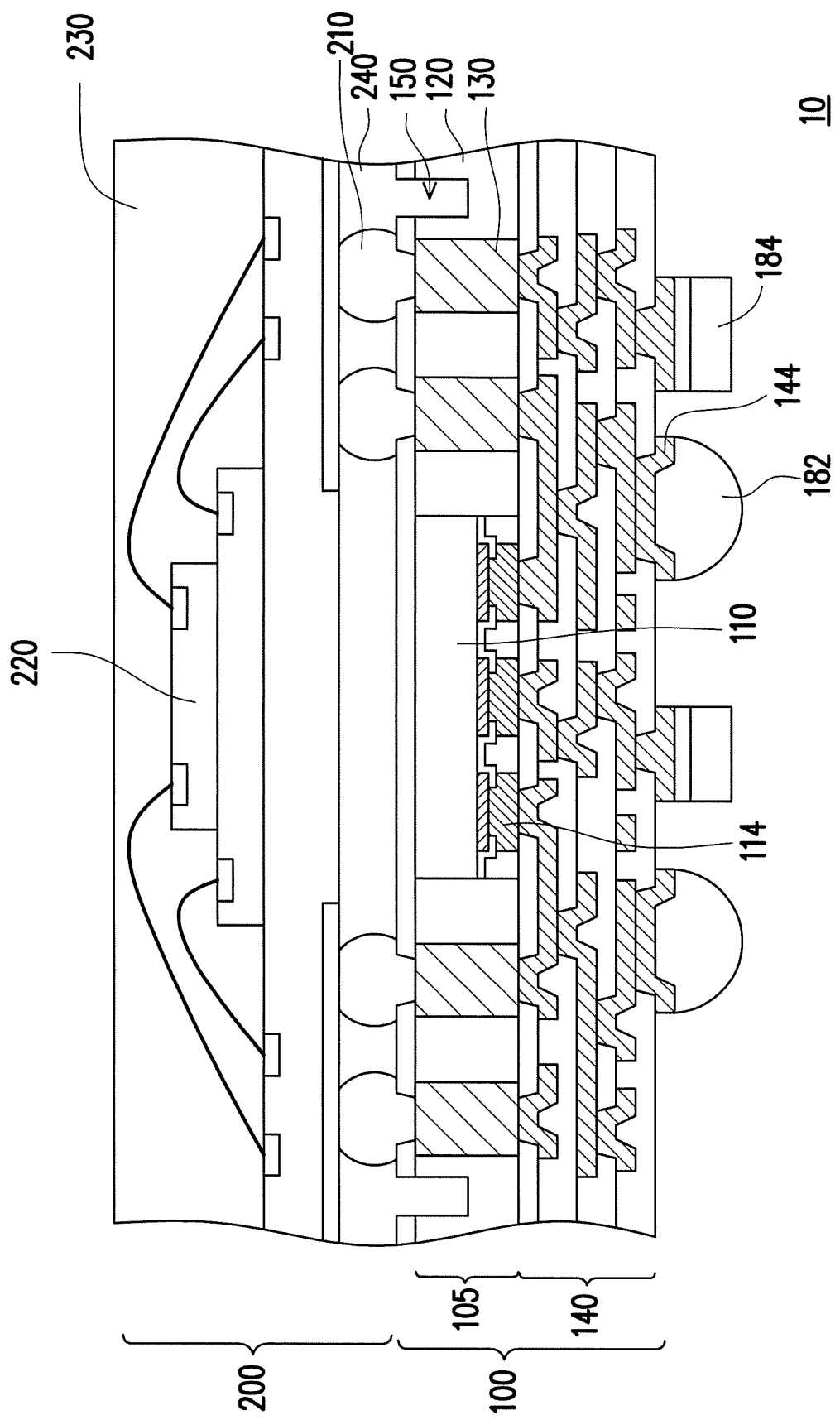
Figure 11:
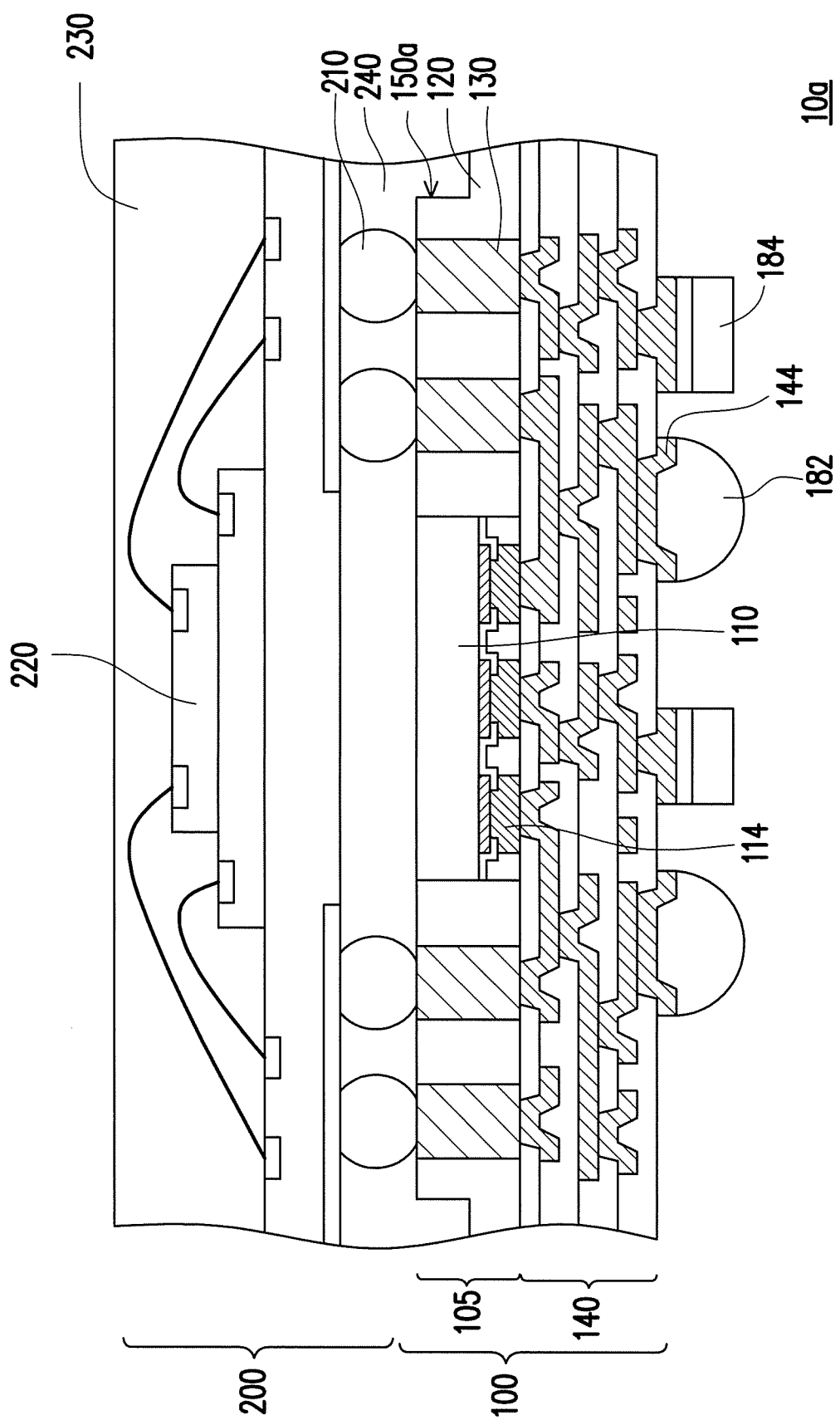
FIG. 11 illustrates a cross sectional view of a package on package structure according to some exemplary embodiments of the present disclosure.

In some embodiments, the intermediate stages of forming the PoP structure as shown in FIG. 10 and/or FIG. 11 are described as follows. Referring to FIG. 1, a carrier 160 is provided, and an adhesive layer 165 may be disposed on the carrier 160. In some embodiments, the carrier 160 may be a glass carrier, a ceramic carrier, or the like. The adhesive layer 165 may be a light to heat conversion release coating (LTHC), or the like. In some embodiments, an insulation layer 170*a* may be optionally disposed on the carrier 160, or on the adhesive layer 165 (if any). Then, a plurality of through vias 130 are formed on the carrier 160, and the through vias 130 surrounds a device area A1. In the present embodiment, the through vias 130 are formed on the insulation layer 170*a* located on the carrier 160, but the disclosure is not limited thereto.

Figure 2:
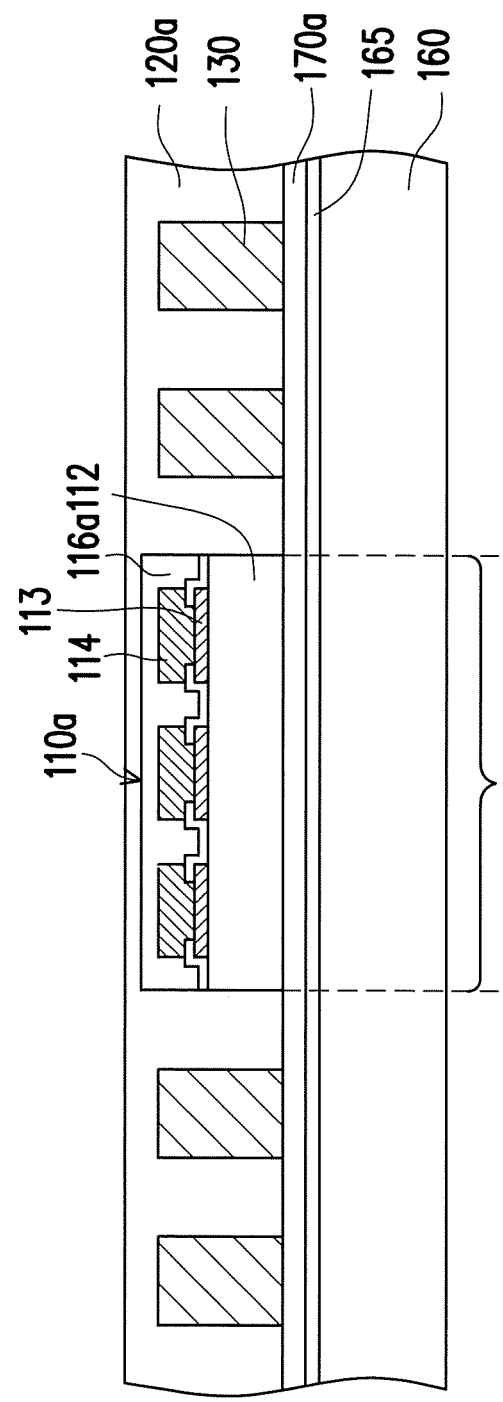

In addition, at least one device die 110*a* as shown in FIG. 2 is formed on the carrier 160 and located at the device area A1. In the present embodiment, the device die 110*a* is formed on the insulation layer 170*a* located on the carrier 160, but the disclosure is not limited thereto. In some embodiments, the device die 110a may be logic device dies including logic circuits therein. In some exemplary embodiments, the device die 110a are dies that are designed for mobile applications, and may include a Power Management Integrated Circuit (PMIC) die and a Transceiver (TRX) die, for example. Although one device die 110a are illustrated, more dies may be placed over the carrier 160 and level with one another.

Figure 13:
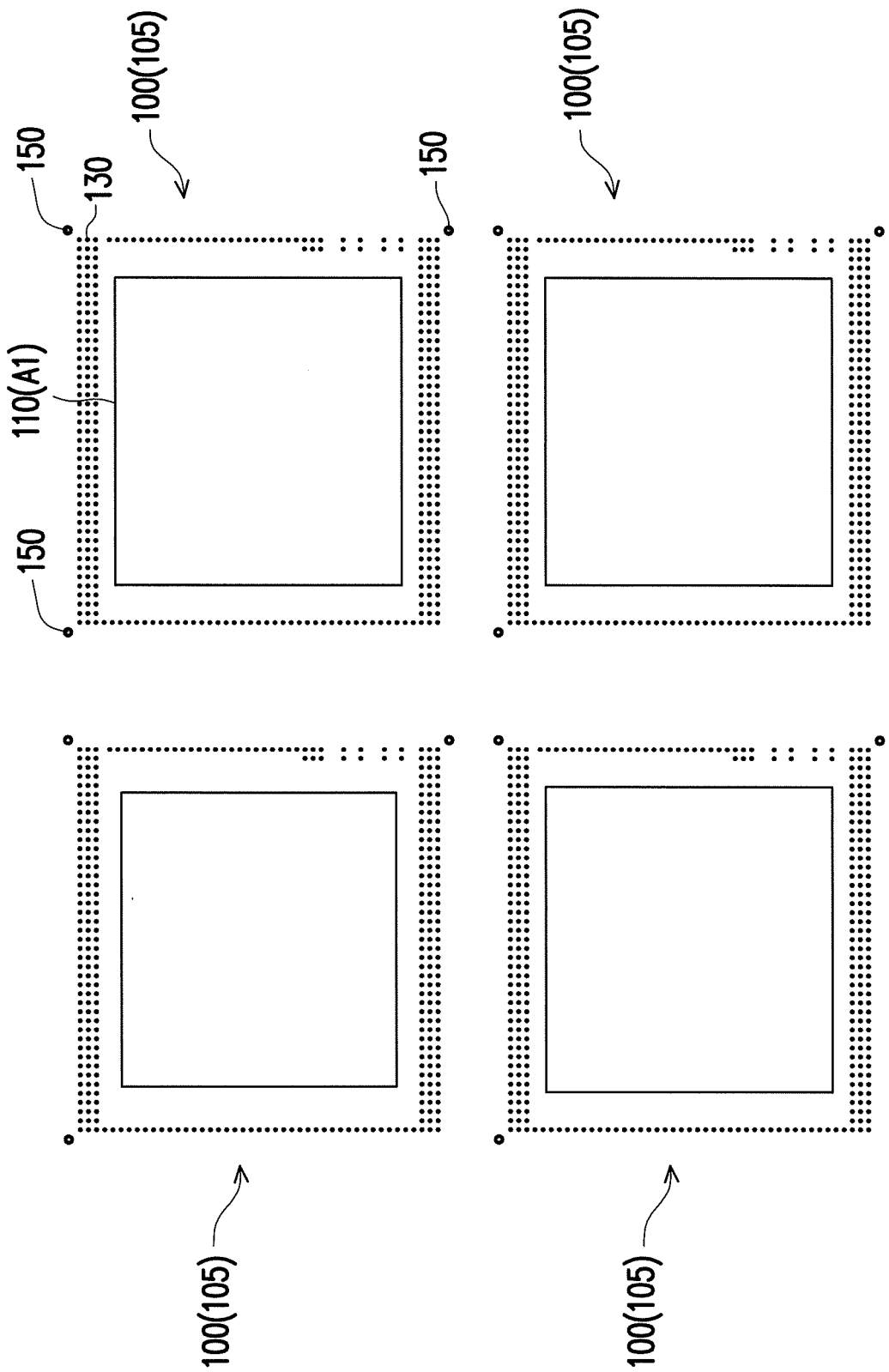
FIG. 13 illustrates a schematic top view of a first package of an intermediate stage in the manufacturing a package on package structure according to some exemplary embodiments of the present disclosure.

In some embodiments, the carrier 160 may include a plurality of die areas A1 arranged in, for example, an array manner. Accordingly, the through vias 130 may be formed to surround each of the die areas A1 as it is illustrated in FIG. 13, and a plurality of device dies 110a may be disposed on the die areas A1 respectively, so the through vias 130 may surround each of the device dies 110a. With such arrangement, a plurality of POP structures can be formed concurrently. For the sake of brevity and clarity, the manufacturing process of one of the POP structures is illustrated in FIG. 1 to FIG. 11. For example, one of the die areas A1 surrounded by some of the through vias 130 are illustrated in FIG. 1.

In some embodiments, the through vias 130 may be pre-formed, and are then placed on the carrier 160. In alternative embodiments, the through vias 130 may be formed by, for example, plating process. The plating of the through vias 130 may be performed before the placement of the device die 110a, and may include forming a seed layer (not shown) over carrier 160, forming and patterning a photo resist layer (not shown), and plating the through vias 130 on the portions of the seed layer that are exposed through the photo resist layer. The photo resist layer and the portions of the seed layer covered by the photo resist layer may then be removed. The device die 110a may then be placed over the carrier 160. The material of the through vias 130 may include copper, aluminum, or the like. Accordingly, the bottom ends of the through vias 130 are substantially level with the back surface of the device die 110a.

In some exemplary embodiments, a plurality of conductive vias 114 (such as copper vias) may be formed on an active surface (e.g. the top surface) of the device die 110a and electrically coupled to the pads 113 on the substrate 112 of the device die 110a. In some embodiments, a dielectric layer 116a may be formed on the active surface (e.g. the top surface) of the device die 110a, and may cover the top surfaces of the conductive vias 114. In other embodiments, the top surface of the dielectric layer 116a may be substantially level with the top surfaces of the conductive vias 114. Alternatively, the dielectric layer 116a may be omitted, and the conductive vias 114 protrude from the active surface of the device die 110. In some embodiments, the top ends of the through vias 130 may be substantially level with the top surfaces of the conductive vias 114. In other embodiments, the top ends of the through vias 130 may be substantially higher than the top surfaces of the conductive vias 114. Alternatively, the top ends of the through vias 130 may be substantially lower than the top surfaces of the conductive vias 114 but substantially higher than the bottom surfaces of the conductive vias 114.

Then, the device die 110 and the through vias 130 on the carrier 160 are encapsulated by an insulating encapsulation 120a. In other words, the insulating encapsulation 120a is formed on the carrier 160 to encapsulate the through vias 130 and the device die 110a at the device area A1. In some embodiments, the insulating encapsulation 120a fills the gaps between the device die 110a and the through vias 130, and may be in contact with the insulation layer 170a. The insulating encapsulation 120a may include a molding compound, an epoxy, or a resin, etc. In some embodiments, a top surface of the insulating encapsulation 120a may be higher than the top ends of the through vias 130 and the top surface of the dielectric layer 116a. Namely, the insulating encapsulation 120a covers the top ends of the through vias 130 and the top surface of the dielectric layer 116a.

Figure 3:
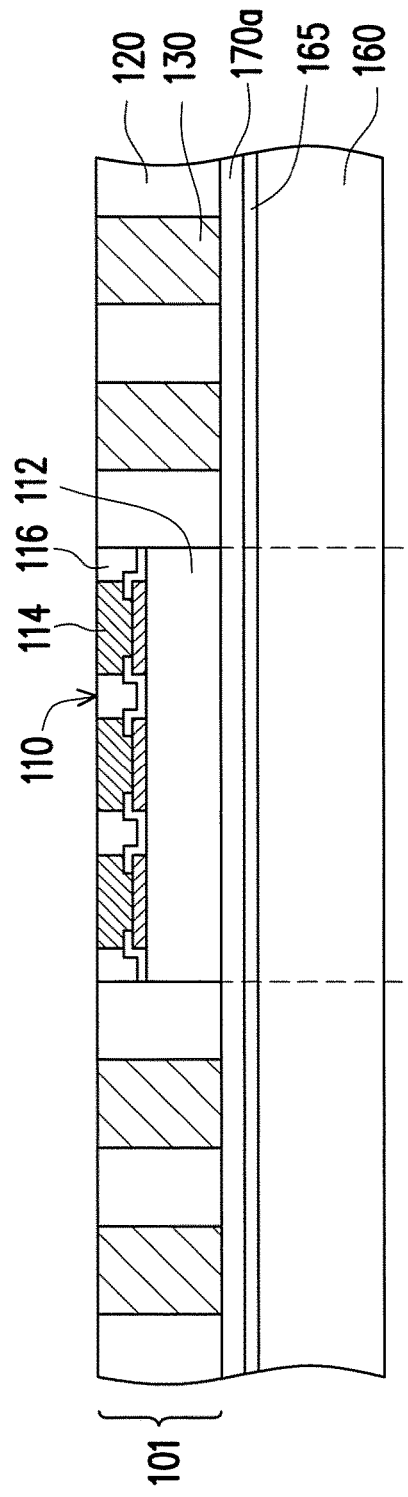

Then, a thinning process, which may be a grinding process, is performed to thin the insulating encapsulation 120a (and the dielectric layer 116a) until the top ends of the through vias 130 and the top surfaces of the conductive vias 114 are revealed. The resulting structure is shown in FIG. 3. Due to the thinning process, the top ends of the through vias 130 are substantially level with the top surfaces of the conductive vias 114, and are substantially level with the top surface of the insulating encapsulation 120 and the top surface of the dielectric layer 116 as shown in FIG. 3. Throughout the description, the resultant structure including the device die 110, the through vias 130 and the insulating encapsulation 120 as shown in FIG. 3 is referred to as structure 101, which may have a wafer form in the process. Accordingly, in the structure 101, the device die 110 is disposed at the die area A1, the through vias 130 extend through the structure 101 outside of the die area A1, and the insulating encapsulation 120 encapsulates the device die 110 and the through vias 130. In other words, the insulating encapsulation 120 encapsulates the device die 110 therein, and the through vias 130 extends through the insulating encapsulation 120.

Figure 4:
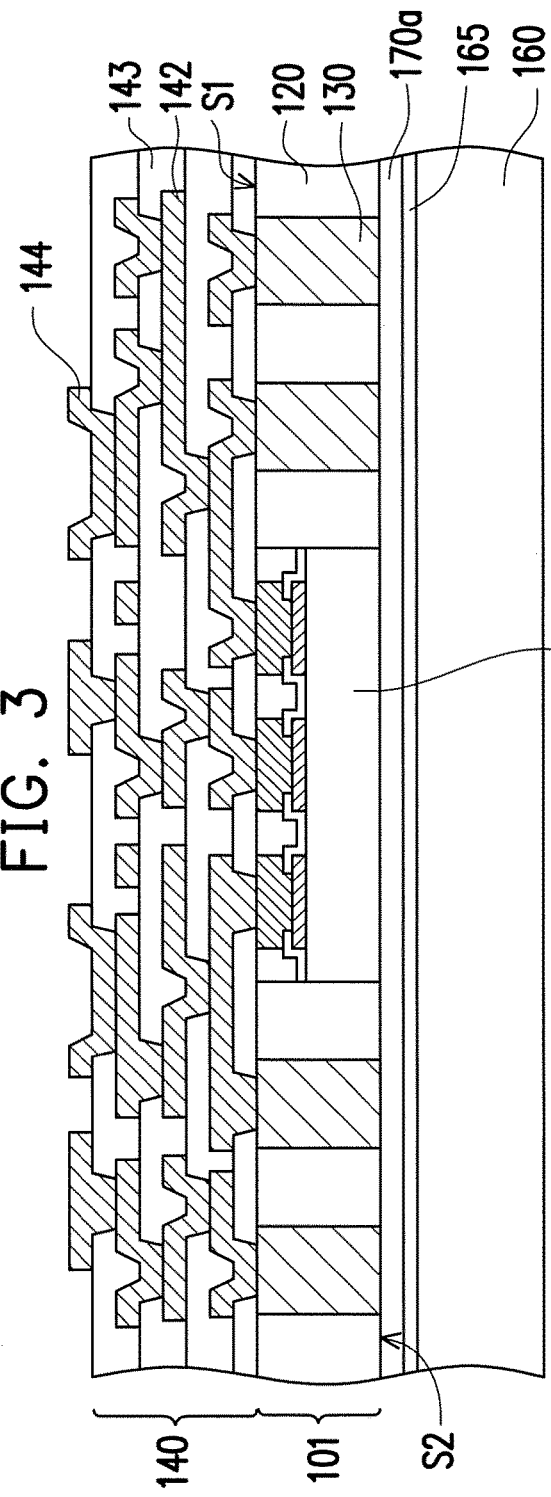

Next, referring to FIG. 4, a redistribution circuit structure 140 is formed on the device die 110 and a first side S1 of the insulating encapsulation 120. The redistribution circuit structure 140 is electrically connected to the device die 110 and the through vias 130. In some embodiments, the redistribution circuit structure 140 are formed over the structure 101 to connect to the conductive vias 114 of the device die 110 and the through vias 130. In some embodiments, the redistribution circuit structure 140 may also interconnect the conductive vias 114 and the through vias 130. The redistribution circuit structure 140 may be formed by, for example, depositing conductive layers, patterning the conductive layers to form redistribution circuits 142, partially covering the redistribution circuits 142 and filling the gaps between the redistribution circuits 142 with dielectric layers 143, etc. The material of the redistribution circuits 142 may include a metal or a metal alloy including aluminum, copper, tungsten, and/or alloys thereof. The dielectric layers 143 may be formed of dielectric materials such as oxides, nitrides, carbides, carbon nitrides, combinations thereof, and/or multi-layers thereof. The redistribution circuits 142 are formed in the dielectric layers 143 and electrically connected to the device die 110 and the through vias 130. In addition, an Under Bump Metallurgy (UBM) layer 144 may be formed on the redistribution circuit structure 140 by sputtering, evaporation, or electroless plating, etc.

Figure 5:
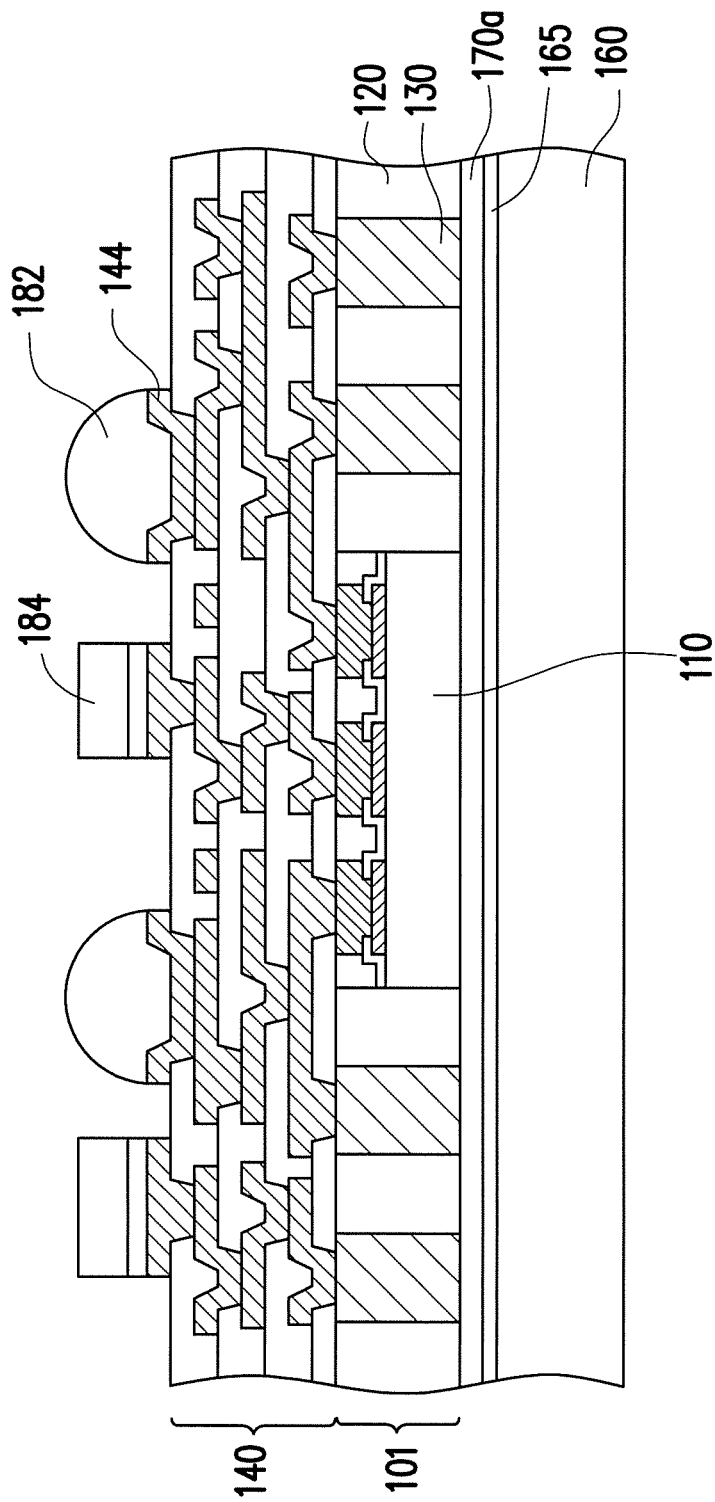

Referring to FIG. 5, at least one of electrical connector 182 and at least one Integrated Passive Device (IPD) 184 are disposed on the redistribution circuit structure 140 in accordance with some exemplary embodiments. The formation of the electrical connectors 182 may include placing solder balls on the UBM layer 144 (or on the redistribution circuit structure 140), and then reflowing the solder balls. In alternative embodiments, the formation of the electrical connectors 182 may include performing a plating process to form solder regions on the UBM layer 144 (or on the redistribution circuit structure 140), and then reflowing the solder regions. The electrical connector 182 may also include conductive pillars, or conductive pillars with solder caps, which may also be formed through plating. The IPD 184 may be fabricated using standard wafer fabrication technologies such as thin film and photolithography processing, and may be mounted on the redistribution circuit structure 140 through, for example, flip-chip bonding or wire bonding, etc.

Figure 6:
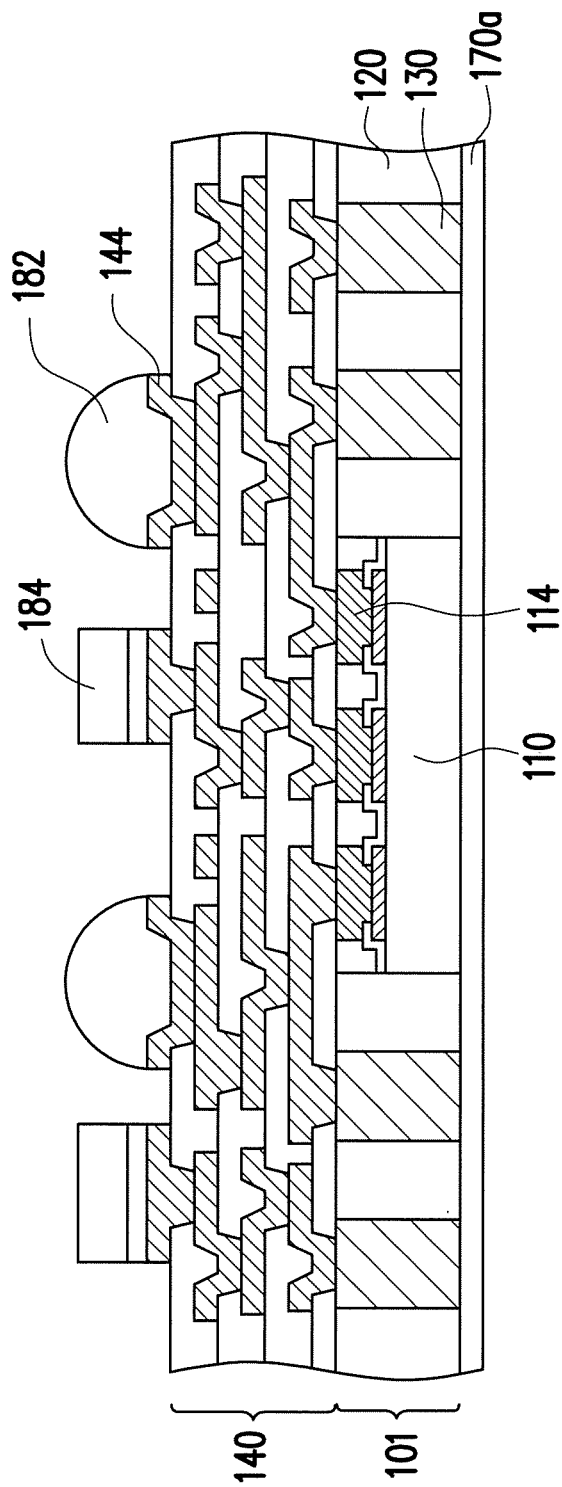

Then, referring to FIG. 6, the carrier 160 may be removed. In some embodiments, the carrier 160 is detached from the structure 101, and the insulation layer 170a (if any), by causing the adhesive layer 165 to lose or reduce adhesion. The adhesive layer 165 is then removed along with the carrier 160. For example, the adhesive layer 165 may be exposed to UV light, so that the adhesive layer 165 loses or reduces adhesion, and hence the carrier 160 and the adhesive layer 165 can be removed from the structure 101.

After the carrier 160 is removed, the bottom ends of the through vias 130 are revealed. In the illustrated structure, the bottom ends of the through vias 130 are level with the bottom surface of the device die 110 and the bottom surface of the insulating encapsulation 120. In the embodiments of the insulation layer 170a being omitted, a grinding process may be performed to lightly grind the back surface of device die 110 and the bottom ends of the through vias 130. Alternatively, the grinding process may be skipped.

Figure 7:
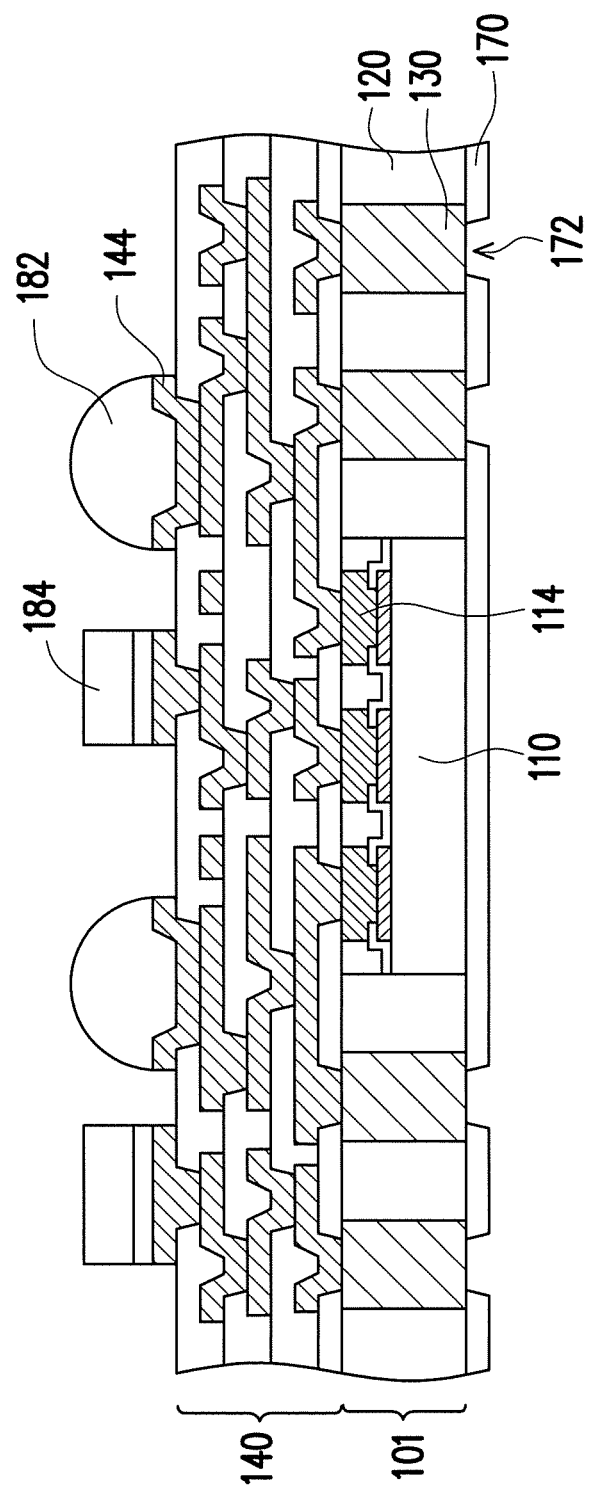

Referring to FIG. 7, in the embodiments having the insulation layer 170a, a patterning process may then be performed on the insulation layer 170a to form a plurality of openings 172. Accordingly, the insulation layer 170 having a plurality of openings 172 are formed. The openings 172 are located on the through vias 130 respectively to reveal the bottom ends of the through vias 130. In some embodiments, the openings 172 may be formed by photolithography process, laser drilling process, etc.

Figure 8:
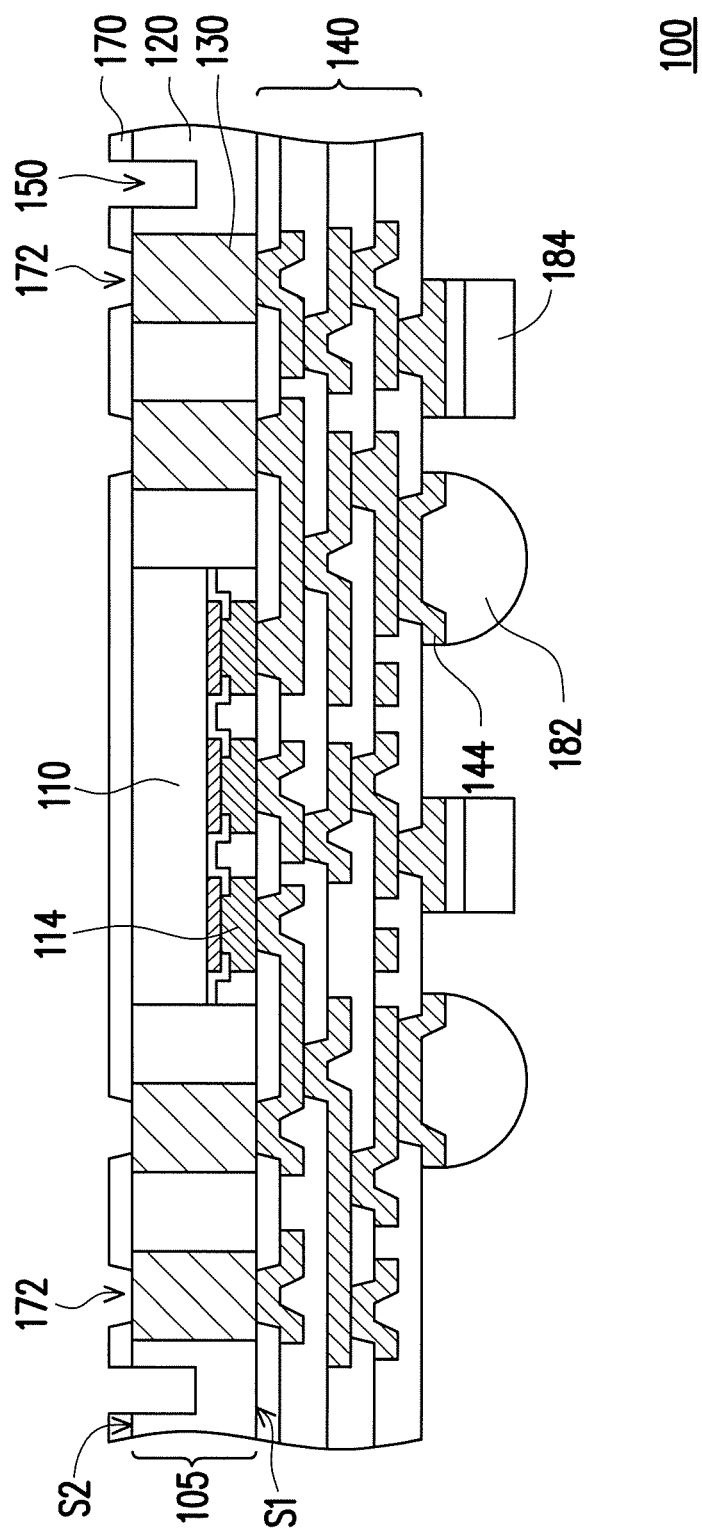

Referring to FIG. 8, an alignment notch 150 is formed on a second side S1 of the insulating encapsulation 120, and the second side S1 is opposite to the first side S1. Namely, the redistribution circuit structure 140 and the alignment notch 150 are disposed on two opposite sides S1, S2 of the insulating encapsulation 120. The through vias 130 are located between the device die 110 and the alignment notch 150. Accordingly, the resulting structure is a first package 100 (semiconductor package 100) as shown in FIG. 8. In some embodiments, the alignment notch 150 may be a recess dented toward the first side S1 of the insulating encapsulation 120 as shown in FIG. 8. In some embodiments, the alignment notch 150 and the openings 172 of the insulation layer 170 may be formed by different process. In other embodiments, the same laser drilling process for forming the openings 172 of the insulation layer 170 may form the alignment notch 150. In some embodiments, the first package 100 may further include a filler filled in the alignment notch 150.

Throughout the description, the combined structure including the device die 110, the through vias 130 and the insulating encapsulation 120 and the alignment notch 150 as shown in FIG. 8 is referred to as encapsulated semiconductor device 105, which may have a wafer form in the process. Accordingly, in the encapsulated semiconductor device 105, the device die 110 is disposed at the die area A1, the through vias 130 extend through the insulating encapsulation 120 and located between the device die 110 and the alignment notch 150, and the insulating encapsulation 120 encapsulates the device die 110 and the through vias 130. The redistribution circuit structure 140 is disposed on the first side S1 of the insulating encapsulation 120 of the encapsulated semiconductor device 105, while the alignment notch 150 disposed on the second side S1 of the insulating encapsulation 120 of the encapsulated semiconductor device 105.

Figure 12:
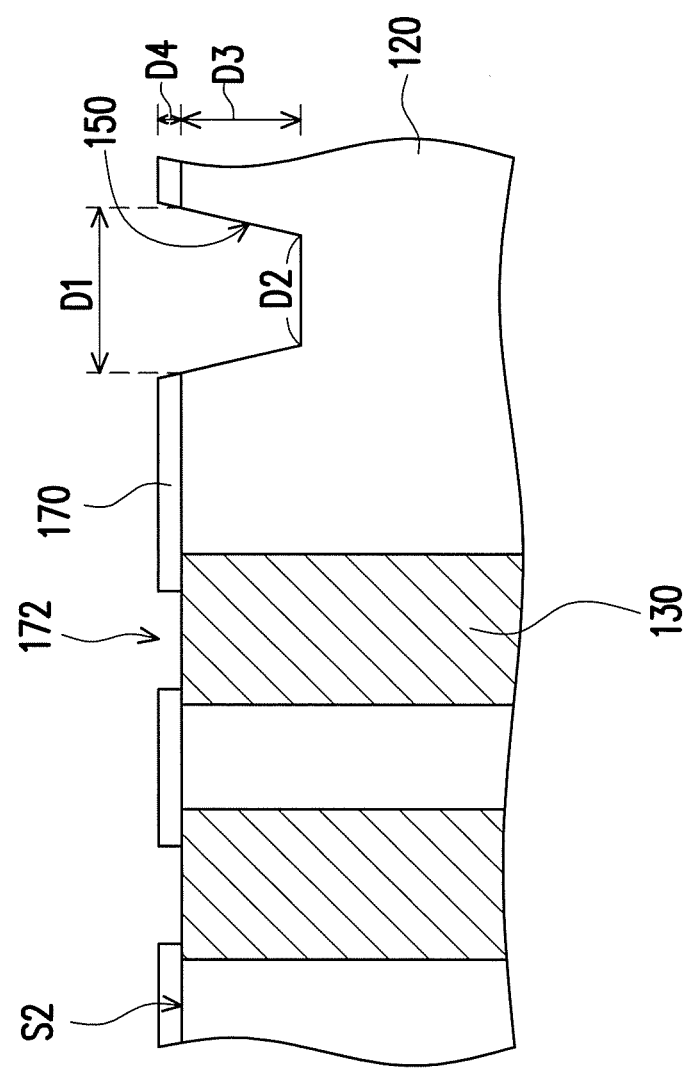
FIG. 12 illustrates a partial cross sectional view of a first package according to some exemplary embodiments of the present disclosure.

FIG. 12 illustrates a partial cross sectional view of a first package according to some exemplary embodiments of the present disclosure. Referring to FIG. 8 and FIG. 12, in some embodiments, the alignment notch 150 may be formed by laser drilling, mechanical drilling or other suitable method. As a result, an inner surface of the alignment notch 150 may be a rough surface, and the alignment notch 150 extends through the insulation layer 170 toward the second side S2 of the insulating encapsulation 120 so that the insulation layer 170 reveals the through vias 130 and the alignment notch 150. In some embodiments, the dimension D1 (e.g. diameter) of the alignment notch 150 on the second side S2 is substantially greater than the dimension D2 (e.g. diameter) of a bottom surface of the alignment notch 150 as shown in FIG. 12. For example, the dimension D1 may range from about 130 µm to about 200 µm, the dimension D2 may range from about 100 µm to about 150 µm, and the depth D3 of the alignment notch 150 may range from about 10 µm to about 20 µm. In addition, the depth D4 of the passivation 170 may range from about 7 µm to about 10 µm.

FIG. 13 illustrates a schematic top view of a first package of an intermediate stage in the manufacturing a package on package structure according to some exemplary embodiments of the present disclosure. It is noted that FIG. 13 illustrate a top view of multiple first packages 100 as shown in FIG. 8 arranged in a wafer form. Accordingly, the through vias 130 surround each of the die areas A1, and the device dies 110 are disposed on the die areas A1. Referring to FIG. 8 and FIG. 13, in some embodiments, for each of the first packages 100, the alignment notch 150 may be disposed on a corner of the insulating encapsulation 120 of the encapsulated semiconductor device 105. In some embodiments, each of the first packages 100 may include a plurality of alignment notches 150, which are disposed on some of the corners of the encapsulated semiconductor device 105. In such embodiments, for each of the first packages 100, the number of the alignment notches 150 is less than the number of the corners of the encapsulated semiconductor device 105 so as to identify orientation of each first package 100. In alternative embodiments, for each of the first packages 100, the shapes of the alignment notches 150 may be different from one another to identify orientation of each first package 100. Accordingly, another package can be mounted on each of the first packages 100 by performing alignment according to the alignment notch 150. With such arrangement, unlike the conventional alignment pillars would be buried into the insulating encapsulation due to warpage of the first package, the alignment notch 150 is capable of performing alignment even under significant warpage of the first package 100.

Figure 8A:
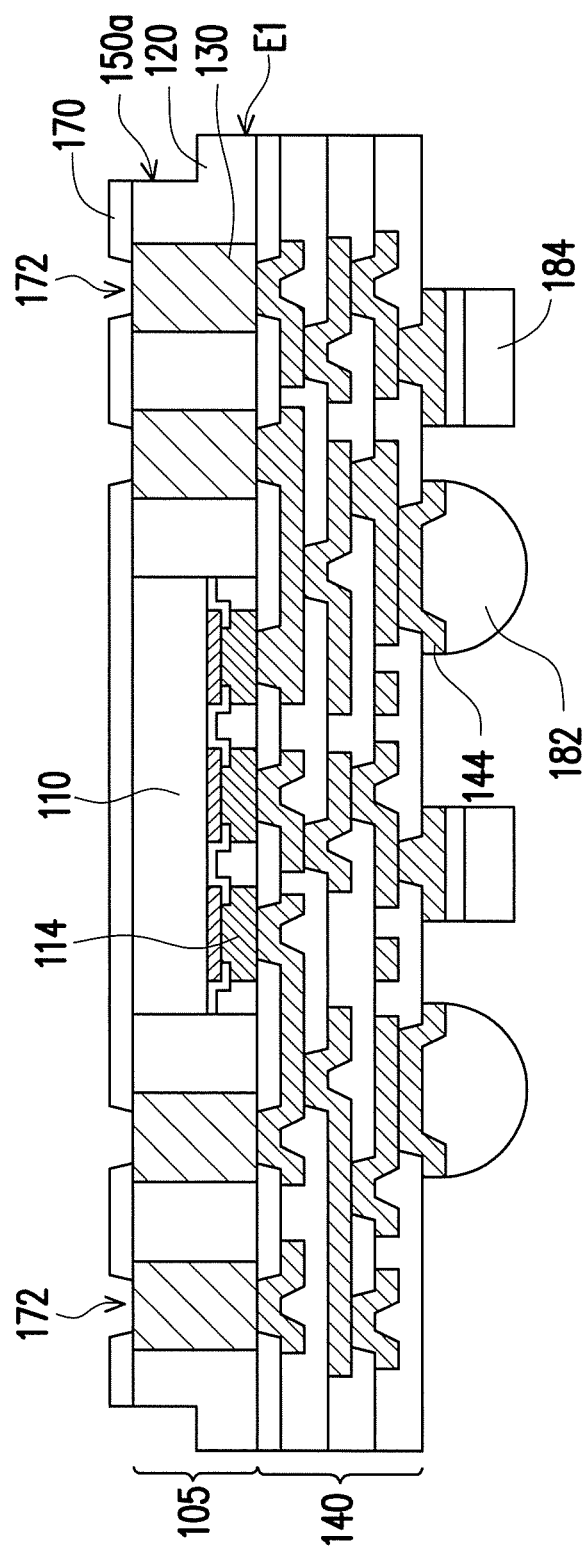
Figure 14:
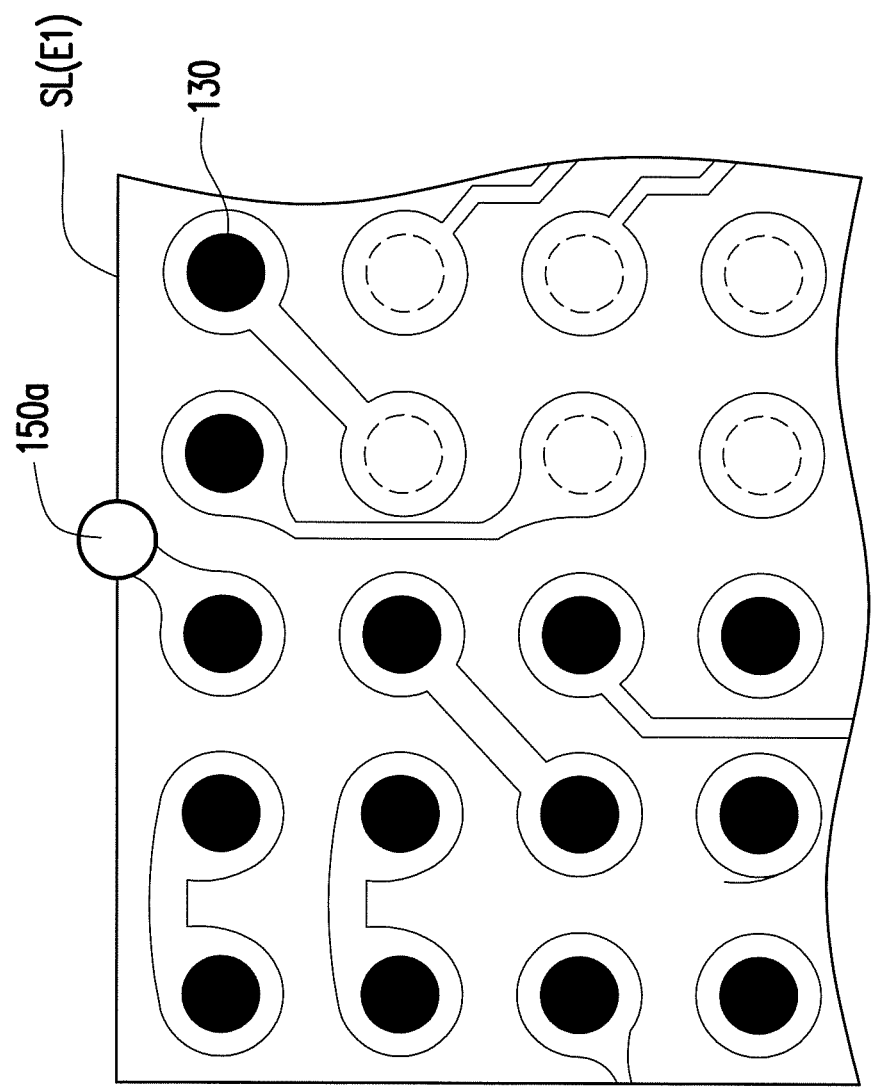
FIG. 14 illustrates a schematic top view of a first package according to some exemplary embodiments of the present disclosure.

FIG. 8A and FIG. 14 illustrate a first package 100a according to a different exemplary embodiment from the exemplary embodiment shown in FIG. 8. It is noted that the first package 100a shown in FIG. 8A contains many features same as or similar to the first package 100 disclosed earlier with FIG. 8. For purpose of clarity and simplicity, detail description of same or similar features may be omitted, and the same or similar reference numbers denote the same or like components. The main differences between the first package 100a shown in FIG. 8A and the first package 100 shown in FIG. 8 are described as follows.

Referring to FIG. 8A and FIG. 14, in some embodiments, the alignment notch 150a may be disposed along a scribe line SL of the first package 100a. In some embodiments, the alignment notch 150a may not necessarily be disposed at a corner of the first package 100a but disposed on anywhere along the scribe line SL. With the arrangement, when the singularizing process is performed to saw along the scribe line SL, the alignment notch 150a is partially cut and located on an edge E1 of the first package 100a. Accordingly, a bottom surface of the alignment notch 150a is extended to the edge E1 (e.g. side surface) of the insulating encapsulation 120 of the first package 100a as shown in FIG. 8A.

Figure 9:
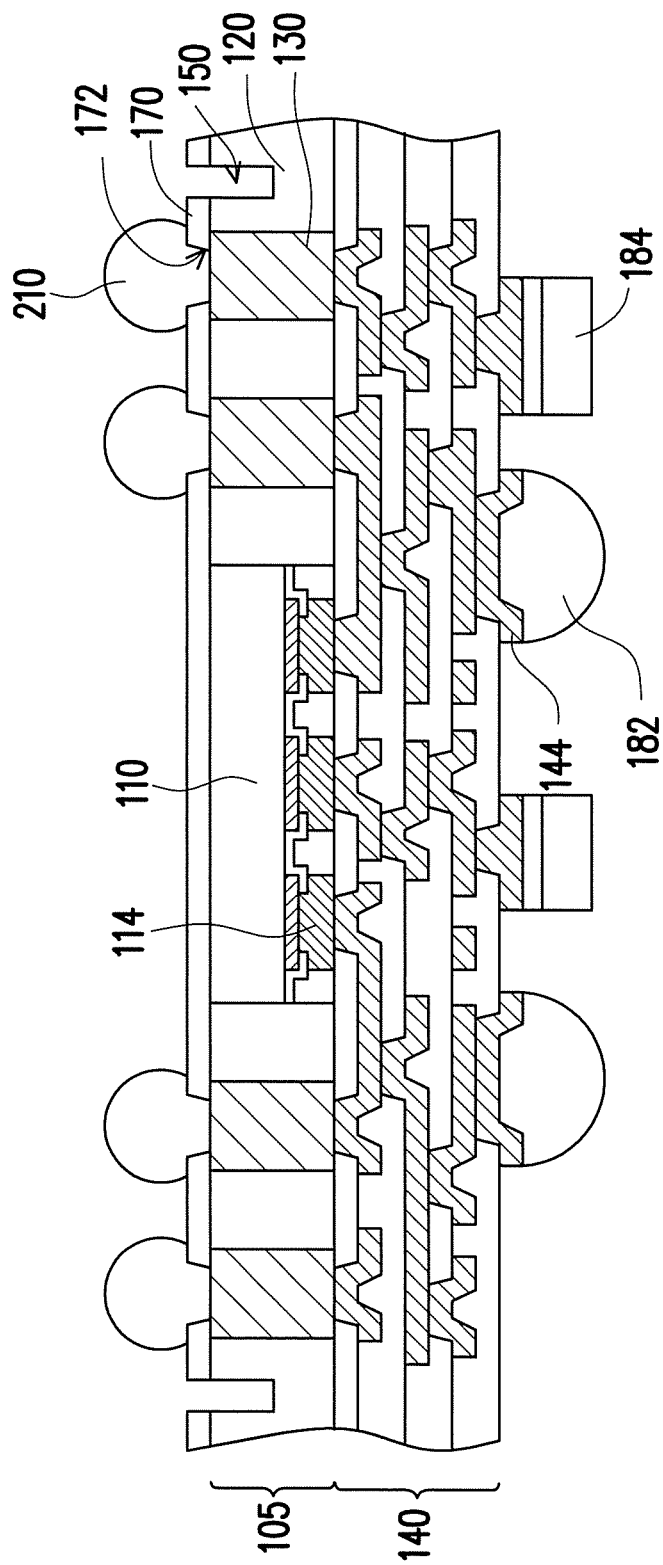
Figure 15:
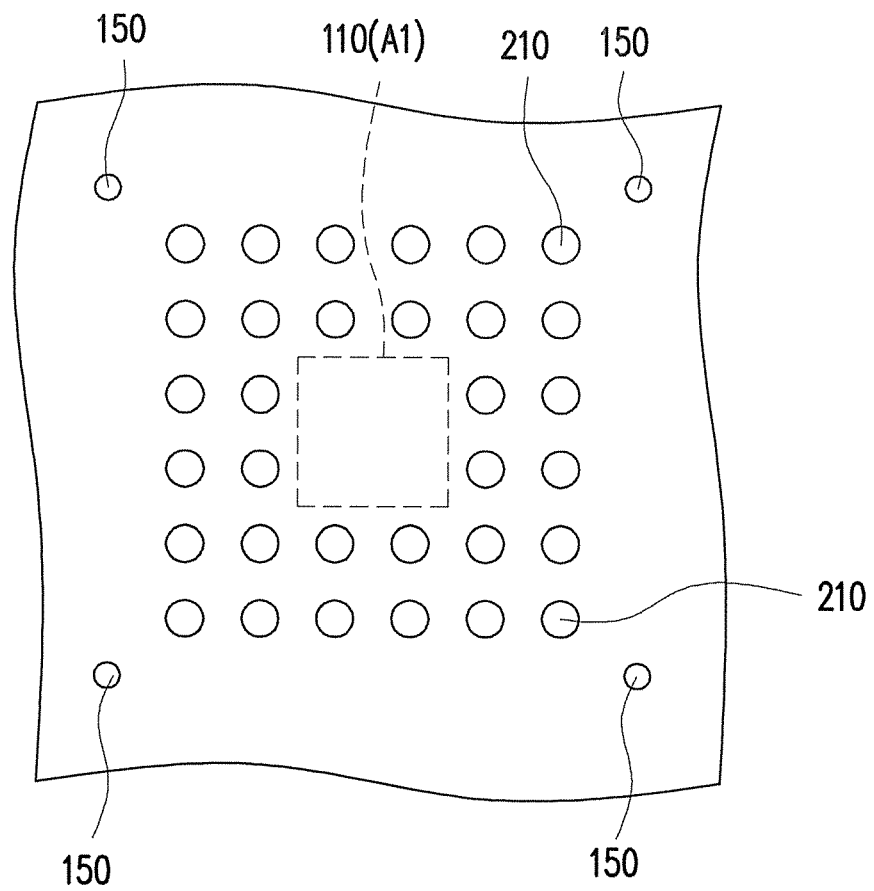
FIG. 15 illustrates a schematic top view of a first package of an intermediate stage in the manufacturing a package on package structure shown in FIG. 9.

Referring to FIG. 9 and FIG. 15, a plurality of electrical terminals 210 may be formed on the encapsulated semiconductor device 105 to be electrically connected to the through vias 130. In some embodiments, the electrical terminals 210 are disposed in the openings 172 of the insulation layer 170 to be connected to the through vias 130.

Then, referring to FIG. 10, a second package 200 is disposed on the first package 100 according to the alignment notch 150 and is electrically connected to the through vias 130 through the electrical terminals 210 of the second package 200. The second package 200 is mounted on the first package 100 in a manner of the second package 200 facing the second side S2 of the insulating encapsulation 120 and is aligned with the first package 100 by the alignment notch 150. Accordingly, the resulting structure is a package on package structure 10 as shown in FIG. 10. In some embodiments, the second package 200 may be packages, device dies, passive devices, and/or the like. In some embodiments, the package on package structure 10 may combine vertically discrete memory and logic packages, and the second package 200 may be employed in a memory such as Dynamic Random Access Memory and others, but the disclosure is not limited thereto.

In some embodiments, the bonding between the first package 100 and the second package 200 may be performed using flip chip bonding through the electrical terminals 210, which may comprise solder, for example. In some embodiments, an underfill 240 may be formed between the first package 100 and the second package 200 to encapsulate the electrical terminals 210 and fills the alignment notch 150. In some embodiments, the filler mentioned above may be the underfill 240 or other suitable filler.

It is appreciated that device die 110 in the first package 100 and the device die 220 in the second package 200 may be arranged differently than in the illustrated exemplary embodiments. In some embodiments, the device die 220 is encapsulated by the insulating encapsulation 230. Then, the wafer-level package may then be sawed into a plurality of package on package structures 10 independent from one another, with each of the package on package structures 10 including one second package 200 bonded to one first package 100.

FIG. 11 illustrates a cross sectional view of a package on package structure according to a different exemplary embodiment from the exemplary embodiment shown in FIG. 10. It is noted that the package on package structure 10a shown in FIG. 11 contains many features same as or similar to the package on package structure 10 disclosed earlier with FIG. 10. For purpose of clarity and simplicity, detail description of same or similar features may be omitted, and the same or similar reference numbers denote the same or like components. The main differences between the package on package structure 10a shown in FIG. 11 and the package on package structure 10 shown in FIG. 10 are described as follows.

Referring to FIG. 11, in the first package 100b of the exemplary embodiment, the insulation layer 170 is omitted. Accordingly, the electrical terminals 210 are disposed directly on the through vias 130. In addition, the bottom surface of the alignment notch 150a may be extended to the edge of the first package 100b. It is appreciated that the alignment notch may be arranged differently than in the illustrated exemplary embodiments. With such arrangement, unlike the alignment pillars would be buried into the insulating encapsulation due to warpage of the first package, the alignment notch 150a is capable of performing alignment even under significant warpage of the package on package structure 10a.

In accordance with some embodiments of the disclosure, a semiconductor package includes an encapsulated semiconductor device and a redistribution circuit structure. The encapsulated semiconductor device includes a device die encapsulated by an insulating encapsulation, a plurality of through vias extending through the insulating encapsulation and an alignment notch disposed on the insulating encapsulation, wherein the through vias are located between the alignment notch and the device die. The redistribution circuit structure is disposed on a first side of the encapsulated semiconductor device and electrically connected to the device die and the through vias, wherein the alignment notch is disposed on a second side of the encapsulated semiconductor device opposite to the first side.

In accordance with some embodiments of the disclosure, the alignment notch is disposed on a corner of the encapsulated semiconductor device.

In accordance with some embodiments of the disclosure, the semiconductor package further includes an insulation layer disposed on the second side and revealing the through vias and the alignment notch.

In accordance with some embodiments of the disclosure, the semiconductor package further includes a filler filled in the alignment notch.

In accordance with some embodiments of the disclosure, a dimension of the alignment notch on the second side is substantially greater than a dimension of a bottom surface of the alignment notch.

In accordance with some embodiments of the disclosure, a dimension of the alignment notch on the second side ranges from about 130 μm to about 200 μm.

In accordance with some embodiments of the disclosure, a bottom surface of the alignment notch is extended to an edge of the insulating encapsulation.

In accordance with some embodiments of the disclosure, a package on package structure includes a first package and a second package. The first package includes an encapsulated semiconductor device and a redistribution circuit structure. The encapsulated semiconductor device includes a die area, an alignment notch and a plurality of through vias extending through the encapsulated semiconductor device outside of the die area and located between the alignment notch and the die area. The redistribution circuit structure is disposed on a first side of the encapsulated semiconductor device and electrically connected to the encapsulated semiconductor device, and the alignment notch is disposed on a second side of the encapsulated semiconductor device opposite to the first side. The second package is disposed on the second side of the encapsulated semiconductor device and includes a plurality of electrical terminals electrically connected to the through vias.

In accordance with some embodiments of the disclosure, the encapsulated semiconductor device further comprises a device die disposed at the die area and an insulating encapsulation encapsulating the device die therein, the alignment notch is disposed on the insulating encapsulation and the through vias extends through the insulating encapsulation.

In accordance with some embodiments of the disclosure, the alignment notch is disposed on a corner of the encapsulated semiconductor device.

In accordance with some embodiments of the disclosure, the first package further comprises an insulation layer disposed on the second side and revealing the through vias and the alignment notch.

In accordance with some embodiments of the disclosure, a dimension of the alignment notch on the second side is substantially greater than a dimension of a bottom surface of the alignment notch.

In accordance with some embodiments of the disclosure, a bottom surface of the alignment notch is extended to an edge of the first package.

In accordance with some embodiments of the disclosure, the package on package structure further comprises an underfill filling between the first package and the second package, wherein the underfill encapsulates the electrical terminals and fills the alignment notch.

In accordance with some embodiments of the disclosure, a method of forming a package on package structure comprises: providing a first package and disposing a second package on the first package according to the alignment notch, wherein the second package faces the second side and comprises a plurality of electrical terminals electrically connected to the through vias. Providing the first package comprises: encapsulating a device die and a plurality of through vias on a carrier by an insulating encapsulation; forming a redistribution circuit structure on the device die and a first side of the insulating encapsulation, wherein the redistribution circuit structure is electrically connected to the device die and the through vias; removing the carrier; and forming an alignment notch on a second side of the insulating encapsulation opposite to the first side.

In accordance with some embodiments of the disclosure, encapsulating the device die and the through vias on the carrier by the insulating encapsulation further comprises: forming the through vias on the carrier, wherein the through vias surround a device area; disposing the device die on the carrier; and forming the insulating encapsulation on the carrier to encapsulate the through vias and the device die at the device area.

In accordance with some embodiments of the disclosure, encapsulating the device die and the through vias on the carrier by the insulating encapsulation further comprises: forming an insulation layer on the carrier before the through vias are formed on the carrier.

In accordance with some embodiments of the disclosure, the method further comprises: forming a plurality of openings on the insulation layer after the carrier is removed, wherein the openings are located on the through vias respectively, the electrical terminals are connected to the through vias through the openings and the alignment notch extends through the insulation layer toward the second side of the insulating encapsulation.

In accordance with some embodiments of the disclosure, the alignment notch is disposed on a corner of the insulating encapsulation.

In accordance with some embodiments of the disclosure, the method further comprises: forming an underfill between the first package and the second package, wherein the underfill encapsulates the electrical terminals and fills the alignment notch.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package comprising:
a lower package comprising:
an encapsulated semiconductor device comprising a device die encapsulated by an insulating encapsulation, a plurality of through vias extending through the insulating encapsulation and an alignment notch disposed on the insulating encapsulation;
a redistribution circuit structure disposed on a first side of the encapsulated semiconductor device and electrically connected to the device die and the through vias; and
a plurality of first electrical terminals, electrically connected to the redistribution circuit structure, wherein the redistribution circuit structure is disposed between the encapsulated semiconductor device and the first electrical terminals;
an upper package, disposed on the lower package and comprising a plurality of second electrical terminals on a bottom surface of the upper package, wherein the through vias are electrically connected to the redistribution circuit structure at a first end and the second electrical terminals at a second end opposite to the first end, the alignment notch is disposed on a second side of the encapsulated semiconductor device opposite to the first side, and is dented from an upper surface of the insulating encapsulation and extended toward the first side, and the second electrical terminals are disposed on the second side of the encapsulated semiconductor device and entirely located outside the alignment notch from a top view.

2. The semiconductor package as claimed in claim 1, wherein the alignment notch is disposed on a corner of the encapsulated semiconductor device.

3. The semiconductor package as claimed in claim 1, further comprising an insulation layer disposed on the second side and revealing the through vias and the alignment notch.

4. The semiconductor package as claimed in claim 1, further comprising a filler fully filled in the alignment notch.

5. The package on package structure as claimed in claim 1, wherein there is free of conductors within the alignment notch.

6. A package on package structure comprising:
an encapsulated semiconductor device comprising a device die encapsulated by an insulating encapsulation and an alignment notch dented on the insulating encapsulation; and
a redistribution circuit structure disposed on a first side of the encapsulated semiconductor device and in contact with a plurality of conductive vias of the device die of the encapsulated semiconductor device, and the alignment notch disposed on a second side of the encapsulated semiconductor device opposite to the first side, wherein the insulating encapsulation comprises a top portion and a bottom portion between the top portion and the redistribution circuit structure, a bottom surface of the alignment notch is in physical contact with an outermost sidewall of the top portion and an outermost sidewall of the bottom portion, and the insulating encapsulation fully fills a region between the bottom surface of the alignment notch and the redistribution circuit structure.

7. The package on package structure as claimed in claim 6, wherein the encapsulated semiconductor device further comprises a plurality of through vias extending through the insulating encapsulation, and the through vias are located between the alignment notch and the device die from a top view.

8. The package on package structure as claimed in claim 6, wherein the first package further comprises an insulation layer disposed on the second side and revealing the through vias and the alignment notch.

9. The package on package structure as claimed in claim 6, wherein the outermost sidewall of the bottom portion is substantially flush with a sidewall of the redistribution circuit structure.

\* \* \* \* \*